United States Patent
Lee et al.

(10) Patent No.: US 8,803,137 B2
(45) Date of Patent: Aug. 12, 2014

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: Seokjong Lee, Gyeongbuk (KR); Sehee Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/723,797

(22) Filed: Dec. 21, 2012

(65) Prior Publication Data

US 2013/0320308 A1     Dec. 5, 2013

(30) Foreign Application Priority Data

May 31, 2012 (KR) .......................... 10-2012-0058452

(51) Int. Cl.
    *H01L 51/00*      (2006.01)

(52) U.S. Cl.
    USPC ............... 257/40; 257/89; 257/102; 257/103; 257/E51.022; 257/E21.007; 438/35; 438/99

(58) Field of Classification Search
    CPC ... H01L 33/08; H01L 51/5024; H01L 51/504; H01L 51/56
    USPC ....................... 257/40, 89, 102, 103, E51.022, 257/E21.007; 438/35, 99
See application file for complete search history.

(56) References Cited

U.S. PATENT DOCUMENTS

2007/0076141 A1*   4/2007   Domoto ............................ 349/69

* cited by examiner

*Primary Examiner* — Tu-Tu Ho
(74) *Attorney, Agent, or Firm* — Fenwick & West LLP

(57) ABSTRACT

The present invention has been made in an effort to provide an organic light emitting display device comprising: a substrate; and subpixels formed on the substrate, each of the subpixels comprising an emission layer consisting of a first host layer made of a first host material, a mixed layer made of the first host material, a dopant material, and a second material, and a second host layer made of the second host material.

10 Claims, 15 Drawing Sheets

(a)

(b)

ORGANIC LIGHT EMITTING DISPLAY DEVICE AND METHOD FOR MANUFACTURING THE SAME

CROSS-REFERENCE TO RELATED APPLICATION

This application claims the benefit of Korean Patent Application No. 10-2012-0058452 filed on May 31, 2012, which is hereby incorporated by reference.

BACKGROUND

1. Field

This document relates to an organic light emitting display device and a method for manufacturing the same.

2. Related Art

An organic light emitting element used in an organic light emitting display device is a self-luminous element in which an emission layer is formed between two electrodes. The organic light emitting element is an element that emits light when electrons and holes are injected from an electron injection electrode (cathode) and a hole injection electrode (anode) to an emission layer and excitons created by recombination of the injected electrons and holes transition from an excited state to a base state.

The organic light emitting display device is divided into a top-emission type, a bottom-emission type, and a dual-emission type according to a light emission direction. The organic light emitting display device is divided into a passive matrix type and an active matrix type according to a driving method.

In the organic light emitting display device, when a scan signal, a data signal, power, etc. are supplied to a plurality of subpixels arranged in a matrix, selected subpixels emit light, thereby displaying an image.

To improve the light emission efficiency and color coordinates of a display, the organic light emitting display device has adopted a microcavity structure in which the thickness of red, green, and blue subpixels is varied. Also, the organic light emitting display device has adopted a stack structure using two emission layers as a way to improve the light emission efficiency and color coordinates of the display panel.

However, it was not easy to control thickness because the microcavity structure and stack structure according to the conventional art basically employ a multilayer structure. Moreover, the conventional microcavity structure and stack structure using the multilayer structure caused the rise in manufacturing costs due to the increased amount of materials used and the increased thickness. Further, the conventional microcavity structure and stack structure using the multilayer structure caused the increase in defect rates resulting from the increased number of processes, the increased costs of additional equipment for a chamber, and the increased number of fine metal masks depending on structures.

SUMMARY

The present invention has been made in an effort to provide an organic light emitting display device comprising: a substrate; and subpixels formed on the substrate, each of the subpixels comprising an emission layer consisting of a first host layer made of a first host material, a mixed layer made of the first host material, a dopant material, and a second material, and a second host layer made of the second host material.

In another aspect, an exemplary embodiment of the present invention provides a method for manufacturing an organic light emitting display device, the method comprising: forming a lower electrode on a substrate; forming an emission layer consisting of a first host layer made of a first host material, a mixed layer made of the first host material, a dopant material, and a second material, and a second host layer made of the second host material; and forming an upper electrode on the emission layer, wherein in the forming of the emission layer, a source deposition unit provided with first and second host sources respectively containing the first and second host materials and a dopant source containing the dopant material is used, and in the forming of the emission layer, deposition is performed while the source deposition unit moves as if scanning, or the source deposition unit is fixed and deposition is performed while the substrate moves as if scanning.

In another aspect, an exemplary embodiment of the present invention provides an organic light emitting display device comprising: a substrate; and a plurality of subpixels formed on the substrate, each of the subpixels comprising a mixed layer formed with a combination of a first host material, a second host material, and a dopant material, wherein a first, second, and third of the subpixels each has a mixed layer of different thickness from each other, wherein the first host material and the second host material are different from each other, and wherein at least some light emission occurs in the mixed layer.

In another aspect, an exemplary embodiment of the present invention provides an organic light emitting display device comprising: a substrate; and at least one subpixel formed on the substrate, the subpixel comprising a plurality of emission layers separated by an intermediate layer, at least one of the emission layers being a mixed layer formed with a combination of a first host material, a second host material, and a dopant material, wherein the first host material and the second host material are different from each other, and wherein at least some light emission occurs in each mixed layer.

In another aspect, an exemplary embodiment of the present invention provides a method for manufacturing an organic light emitting display device, the method comprising: forming a lower electrode on a substrate; changing a relative position between a source deposition unit and a substrate; depositing, using the source deposition unit, on the substrate, an emission layer comprising a first host layer made of a first host material, a mixed layer made of the first host material, a dopant material, and a second host material, and a second host layer made of the second host material, wherein the emission layer is deposited in a single pass of the source deposition unit over the substrate; and forming an upper electrode on the emission layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the embodiments of the present invention, examples of which are illustrated in the accompanying drawings.

Hereinafter, a concrete embodiment of the present invention will be described with reference to the accompanying drawings.

An organic light emitting display device according to the present invention comprises a timing controller, a data driver, a scan driver, and a display panel.

The timing controller receives a vertical synchronization signal, a horizontal synchronization signal, a data enable signal, a clock signal, and a data signal from an external source, for example, an image processor). The timing controller controls operation timings of the data driver and the scan driver using the timing signals such as the vertical synchronization signal, the horizontal synchronization signal, the data enable signal, and the clock signal.

The data driver samples and latches the data signal supplied from the timing controller in response to a data timing control signal supplied from the timing controller, and converts it into a data signal having a parallel data format. The data driver converts a digital data signal into an analog data signal having a parallel data format in response to a gamma reference voltage. The data driver supplies the converted data signal to subpixels included in the display panel through data lines.

The scan driver sequentially generates scan signals in response to a timing control signal supplied from the timing controller. The scan driver supplies the generated scan signals to the subpixels included in the display panel through scan lines.

The display panel comprises subpixels disposed in a matrix form. The subpixels may comprise red, green, and blue subpixels, or comprise white subpixels and a color conversion layer for converting white light of the white subpixels into red, green, and blue light. The subpixels may be of a passive type or active type. For example, an active type subpixel comprises a switching transistor for supplying a data signal in response to a scan signal, a capacitor for storing the data signal at a data voltage, a driving transistor for generating a driving current in response to the data voltage, and an organic light emitting diode for emitting light in response to the driving current. The sub pixels may be configured in a 2T1C (2 transistors and 1 capacitor) structure including a switching transistor, a driving transistor, a capacitor and an organic light emitting diode or in a structure, such as 3T1C, 4T2C, and 5T2C, further including a transistor and a capacitor in addition to 2T1C. The subpixels may be of a top-emission type, a bottom-emission type, or a dual-emission type according to their structure.

The subpixels constituting the display panel have a microcavity structure or stack structure for improving light emission efficiency and color coordinates. This will be described below in more detail.

<First Exemplary Embodiment>

Figure 1:
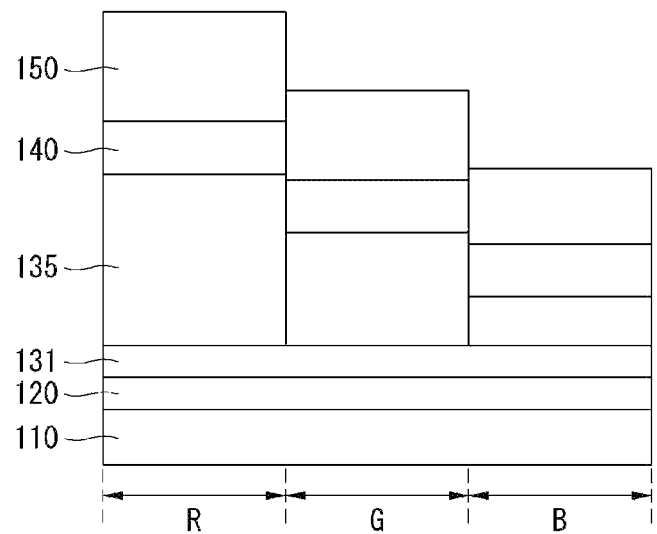
FIG. 1 is a view showing the structure of subpixels according to a first exemplary embodiment of the present invention.
Figure 2:
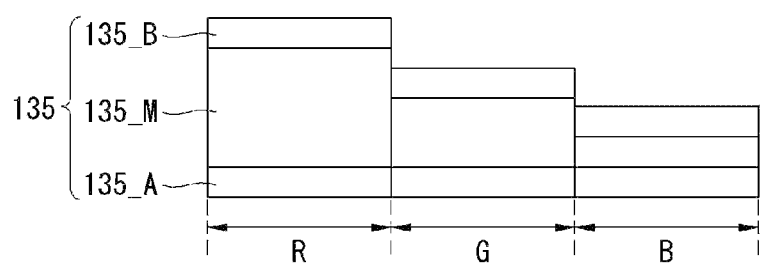
FIG. 2 is a first illustration of an emission layer of FIG. 1.
Figure 3:
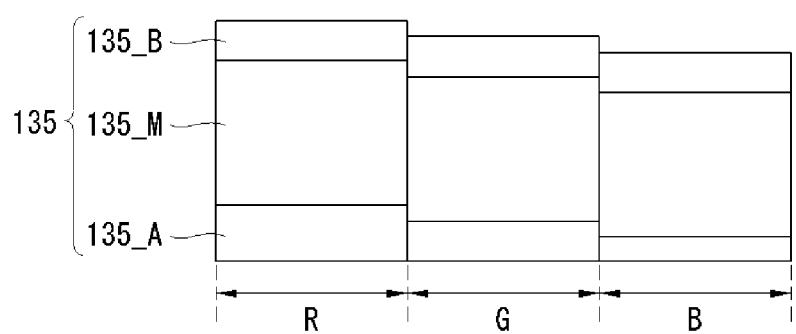
FIG. 3 is a second illustration of the emission layer of FIG. 1.
Figure 4:
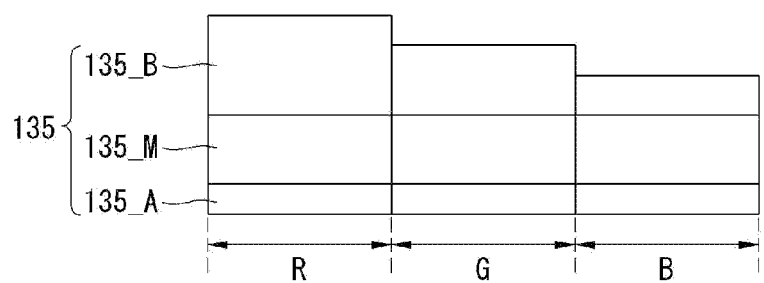
FIG. 4 is a third illustration of the emission layer of FIG. 1.

FIG. 1 is a view showing the structure of subpixels according to a first exemplary embodiment of the present invention. FIG. 2 is a first illustration of an emission layer of FIG. 1. FIG. 3 is a second illustration of the emission layer of FIG. 1. FIG. 4 is a third illustration of the emission layer of FIG. 1.

As shown in FIG. 1, RGB subpixels RGB emitting light of different colors, e.g., red, green, and blue, and having different thicknesses are formed on a substrate 110. The RGB subpixels RGB each comprise a lower electrode 120, a functional layer 131, an emission layer 135, an upper electrode 140, and a protective layer 150. The protective layer 150 may be omitted depending on the structure of the substrate 100.

The electrodes 120 and 140 positioned under and above the emission layer 135 and the functional layer 131 each are equal in thickness among the RGB subpixels RGB, and only the emission layer 135 differs in thickness.

The lower electrode 120 and the upper electrode 140 may be an anode and a cathode, respectively, according to their light emitting method. A description will be made on an example in which the lower electrode 120 acts as an anode and the upper electrode 140 acts as a cathode.

If the lower electrode 120 acts as an anode, the lower electrode 120 may be formed as a single layer electrode comprising an oxide electrode made of ITO (indium tin oxide), IZO (indium zinc oxide), etc, or as a multilayer electrode further comprising a reflection electrode made of silver (Ag) or other low-resistivity metals, in addition to a transparent electrode; however, the present invention is not limited thereto.

If the upper electrode 140 acts as a cathode, a material having a low work function, excellent conductivity, and low surface resistance may be used, an alkali metal or alkaline earth metal of Group 1 or 2 may be used, and the oxide electrode used for the anode may be further used. Examples of the cathode may include, but are not limited to, a single layer electrode or multilayer electrode made of silver Ag, aluminum Al, magnesium Mg, lithium LI, calcium Ca, lithium fluoride LiF, ITO, or IZO, or a combined electrode thereof.

The functionally layer 131 may be a hole injection layer HIL for facilitating the injection of holes. The hole injection layer may be one of p-type, n-type, and organic/inorganic mixed layers. Examples of the hole injection layer may include, but are not limited to, any one or more selected from the group consisting of F4-TCNQ and TCNQ derivatives, HATCN and its derivatives, MoOx, NPD:MgF2, rubrene: MgF2, CuPc (cupper phthalocyanine), PEDOT (poly(3,4)-ethylenedioxythiophene), PANI (polyaniline), and NPD (N,N-dinaphthyl-N,N'-diphenyl benzidine).

Although the foregoing description was given only regarding the hole injection layer as an example of the functional layer 131, the functional layer 131 may comprise at least one or more of the following: a hole injection layer HIL, a hole transparent layer HTL, an electron blocking layer EBL, a hole blocking layer HBL, an electron transport layer ETL, and an electron injection layer EIL. Also, the layers included in the functional layer 131 may be omitted depending on the material which a first host layer and a second host layer are made of.

The emission layer 135 may comprise a first host layer, a mixed layer, and a second host layer, and at least one of the first host layer, mixed layer, and second host layer of each of the RGB subpixels RGB differs in thickness, a description of which will be made below.

As shown in FIGS. 2 to 4, the emission layers 135 of the RGB subpixels RGB comprise a first host layer 135_A made of a first host material, a mixed layer 135_M of the first host material, a dopant material, and a second host material, and a second host layer 135_B made of a second host material.

As shown in the first illustration of FIG. 2, while the first host layer 135_A and second host layer 135_B of the emission layer 135 each are equal in thickness among the RGB subpixels RGB, the mixed layer 135_M differs in thickness. For example, the relationship between the thicknesses of the mixed layers 135_M of the RGB subpixels RGB is in the order of R subpixel R>G subpixel G>B subpixel B. In one implementation, the host layers 135_B and 135_A are significantly thinner than the mixed layer 135_M, for example anywhere in the range of one-tenth to one-thirtieth as thick, inclusive.

As shown in the second illustration of FIG. 3, while the second host layer 135_B and mixed layer 135_M of the emission layer 135 each are equal in thickness among the RGB subpixels RGB, the first layer 135_A differs in thickness. For example, the relationship between the thicknesses of the mixed layers 135_M of the RGB subpixels RGB is in the order of R subpixel R>G subpixel G>B subpixel B.

As shown in the third illustration of FIG. 4, while the first host layer 135_A and mixed layer 135_M of the emission layer 135 each are equal in thickness among the RGB subpixels RGB, the second host layer 135_B differs in thickness. For example, the relationship between the thicknesses of the second host layers 135_B of the RGB subpixels RGB is in the order of R subpixel R>G subpixel G>B subpixel B.

As shown in the example of FIGS. 2 to 4, the RGB subpixels RGB according to the first exemplary embodiment of the present invention achieve a microcavity structure by adjusting the thickness of three layers including the first host layer 135_A, the mixed layer 135_M, and the second host layer 135_B constituting the emission layer 135.

In the above description, the first host material constituting the first host layer 135_A and the second host material constituting the second host layer 135_B are different from each other. For example, the first host material is a hole-type material having a higher hole transportability than the second host material has, and the second host material is an electron-type material having a higher electron transportability than the first host material has.

The first host material may comprise, but are not limited to, arylamine derivatives, biphenyl derivatives, and unlisted metal complexes and pure organic structures. The second host material may comprise, but are not limited to, aluminum complexes, beryllium complexes, oxadiazole derivatives, and unlisted metal complexes and pure organic structures.

In the above description, the dopant material may comprise a phosphorescent organic metal complex compound or phosphor material. The phosphorescent organic metal complex compound may comprise, but are not limited to, heavy metals such as iridium Ir, platinum Pt, gold Au, and osmium Os and rare earths such as europium Eu and terbium Tb. The phosphor material may comprise, but are not limited to, pyrene derivatives, aluminum complexes, anthracene derivatives, rare earth complexes, arylamine derivatives, triazole derivatives, and rubrene derivatives. By the way, the dopant may be one or more of the above-listed materials or unlisted materials.

Figure 5:
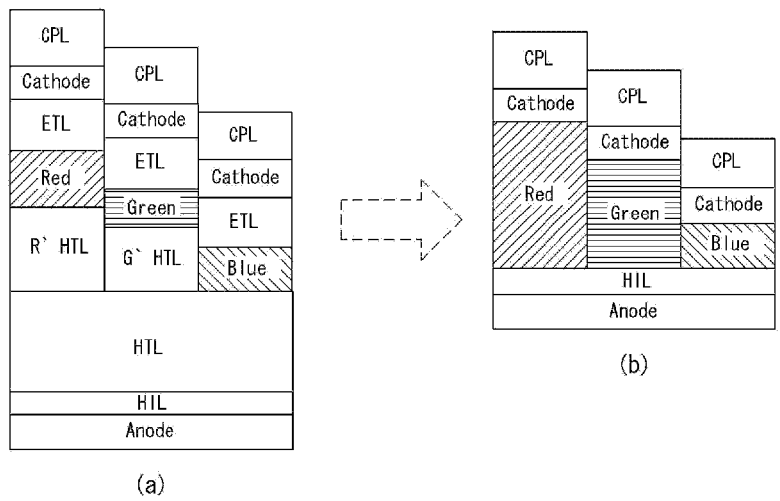
FIG. 5 is a view for comparatively explaining a conventional structure and the structure of the first exemplary embodiment.

FIG. 5 is a view for comparatively explaining a conventional structure and the structure of the first exemplary embodiment.

(a) of FIG. 5 depicts a view showing the structure of conventional subpixels for providing a microcavity effect, and (b) of FIG. 5 depicts a view showing the structure of the subpixels of the first exemplary embodiment for providing a microcavity effect.

As can be seen from (a) of FIG. 5, in the structure diagram of the conventional subpixels, a chamber process of 10 steps or more is required in order to form the illustrated layers, from a hole injection layer HIL to a protective layer CPL. Also, a mask process of 5 EAs or more is required in order to form hole transport layers R'HTL and G'HTL and emission layer Red, Green, and Blue.

As can be seen from (b) of FIG. 5, in the structure diagram of the subpixels of the first exemplary embodiment, a chamber process of 6 steps is used in order to form layers, from a hole injection layer HIL to a protective layer CPL. Also, a mask process of only 3 steps is required in order to form emission layer Red, Green, and Blue.

That is, the structure of the subpixels of the first exemplary embodiment makes thickness control easy because it uses a small lamination structure, compared to the conventional structure. Moreover, the structure of the subpixels of the first exemplary embodiment contributes to preventing a rise in manufacturing costs by decreasing the amount of materials used and thickness because it uses a small lamination structure, compared to the conventional structure. Further, the structure of the subpixels of the first exemplary embodiment can minimize defect rate by decreasing the number of processes and the number of fine metal masks.

The reason why the chamber process and the mask process can be reduced as in the first exemplary embodiment of the present invention is because the thickness of reinforcement interference in the microcavity is applied only to the emission layer. Also, a mixed layer comprising a host material is used as a deposition source unit used in an emission layer chamber.

Prior to conducting a test for an expectation effect of the above-described structure of the first exemplary embodiment, a structure of Comparative Example similar to the structure of the first exemplary embodiment was manufactured, and a test was conducted thereon.

In the test, the optical thickness of the emission layer was set such that the light emission efficiency is highest at 615 nm. The equation used herein is as follows:

Thickness of reinforcement interference in microcavity: $2nd = m\lambda$ where n denotes the refractive index of an organic material, d denotes thickness (nm), m denotes the order of phase waves=1, and λ denotes desired central wavelength=615.

In the test, three elements including A-1, A-2, and A-3 were manufactured based on the above Equation. A reflection electrode formed of a lamination of silver (Ag) of 1000 Å and ITO of 100 Å was used as the anode. An NPD having high hole mobility was used as the first host material Host A of the emission layer. A Be complex derivative having high electron mobility was used as the second host material Host B of the emission layer. An Ir complex derivative was used as the dopant X. The materials and thicknesses of the hole injection layers HIL, cathode, and protective layer CPL were as shown in the following Table 1.

The following Table 1 show the structures, materials, and deposition thicknesses of the A-1, A-2, and A-3 elements, the following Table 2-1 show the driving voltage in volts (V), driving current in milliamperes (mA), driving current density in Joules J (or milliamperes per square centimeter (mA/cm2)), light emission efficiency candela per ampere (cd/A), luminance in candela per square meter (cd/m2), power efficiency in lumens per watt (1 m/W_, and color coordinates x,y of the elements of Table 1, and Table 2-2 show the driving voltage V, driving current mA/cm2, light emission efficiency cd/A, power efficiency lm/W, color coordinates x,y, and photonic efficiency (external quantum efficiency (EQE) %) measured at 2200 nits (cd/m2).

Figure 6:
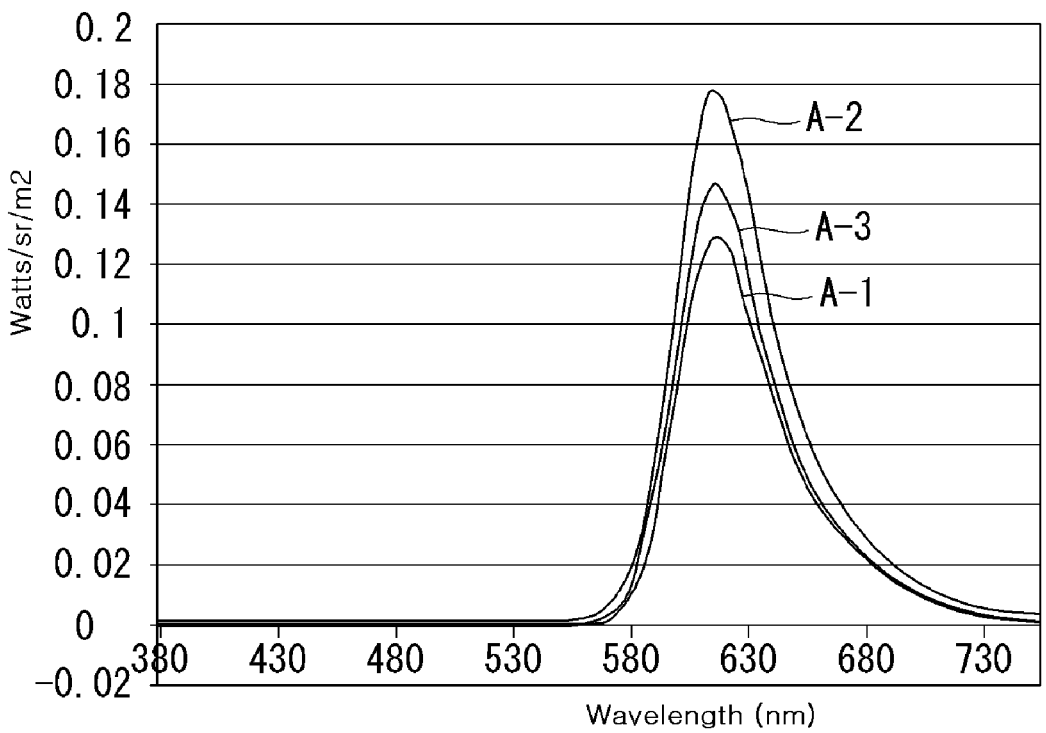
FIG. 6 shows an EL spectrum of the elements of Table 1.
Figure 7:
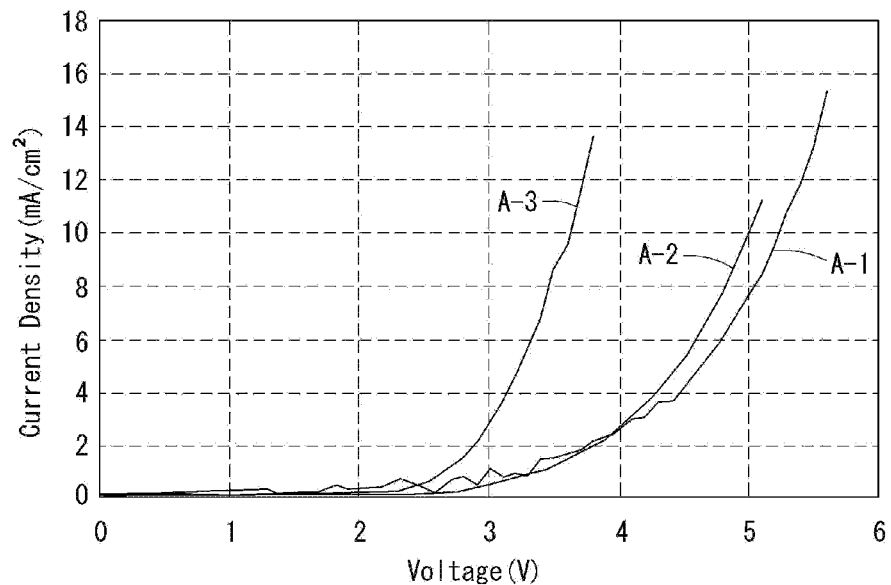
FIG. 7 is a graph showing the driving voltage versus driving current for the elements of Table 1.
Figure 8:
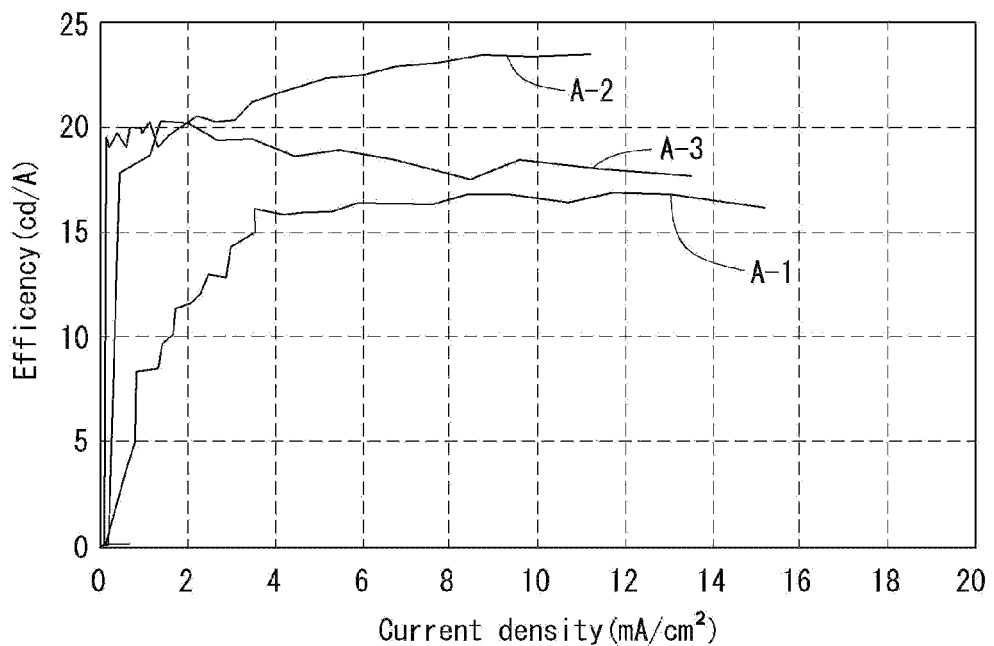
FIG. 8 is a graph showing the light emission efficiency versus driving current for the elements of Table 1.

FIG. 6 shows an energy level spectrum of the elements of Table 1, FIG. 7 is a graph showing the driving voltage versus driving current for the elements of Table 1, and FIG. 8 is a graph showing the light emission efficiency versus driving current for the elements of Table 1.

In Table 1, the emission layer structure of A-1 uses only the mixed layer (Host A+Host B and dopant X), the emission layer structure of A-2 uses only the first host layer (Host A) and the mixed layer (Host A+Host B and dopant X), and the emission layer structure of A-3 uses only the mixed layer (Host A+Host B and dopant X) and the second host layer (Host B).

In the above test, no HTL chamber and no ETL chamber were used, but only the EML chamber was used to deposit the first host material and the second host material at hole and electron transport positions at 50 Å (25 Å for each).

Table 2-1 shows the results of Table 1. Table 2-2 shows the results of measurement at 10 mA/cm2 and 2,200 nits (luminance generally required at full white for a 3-inch panel).

According to the test results, the structures of Comparative Example were advantageous in terms of current efficiency when the first host material (Host A) having good hole transportability was deposited at 25 Å between the hole injection layer HIL and the emission layer EML, and advantageous in terms of driving voltage when the second host material (Host B) having good electron transportability was deposited at 25 Å between the cathode and the emission layer. However, the structures of Comparative Example showed poor life-spans in both cases (see FIGS. 6 to 8).

For another test, the structure of the mixed layer positioned between the first host layer (Host A) and the second host layer (Host B) was varied. The materials of the first host material (Host A), second host material (Host B), and dopant X of the emission layer were identical to those used in the test of Table 1. The materials and thicknesses of the hole injection layer HIL, cathode, and protective layer CPL were also identical to those used in the test of Table 1.

TABLE 1

| | HIL chamber | EML chamber | | | Metal chamber | CPL chamber |
|---|---|---|---|---|---|---|
| | HIL | Host A | Host A + Host B | Host B | Cathode | CPL |
| A-1 | HATCN (50) | — | Host A + B, dopant X 3% (1:1__1100) | — | LiF(10)/ Mg:Ag (9:1__140) | NPD (650) |
| A-2 | | (25) | Host A + B, dopant X 3% (1:1__1075) | — | | |
| A-3 | | — | Host A + B, dopant X 3% (1:1__1075) | (25) | | |

TABLE 2-1

| | V | mA | J(mA/cm$^2$) | cd/A | lm/W | cd/m$^2$ | x | y | others |
|---|---|---|---|---|---|---|---|---|---|
| A-1 | 5.2 | 0.9 | 10 | 17.2 | 10.4 | 1722 | 0.6595 | 0.3381 | |
| A-2 | 5.0 | 0.9 | 10 | 24.0 | 15.2 | 2395 | 0.6585 | 0.3389 | |
| A-3 | 3.7 | 0.9 | 10 | 19.7 | 16.9 | 1966 | 0.6583 | 0.3391 | |

TABLE 2-2

| | | | | | measured at 2200 nits | | |
|---|---|---|---|---|---|---|---|
| | V | mA/cm2 | cd/A | lm/W | x | y | EQE(%) |
| A-1 | 5.5 | 13.3 | 16.6 | 9.5 | 0.659 | 0.338 | 12.8 |
| A-2 | 5.0 | 9.5 | 23.2 | 14.7 | 0.659 | 0.339 | 17.7 |
| A-3 | 3.7 | 12.4 | 17.7 | 14.9 | 0.658 | 0.339 | 13.4 |

The structures of Table 1 comprise a structure in which one of two types of materials including the first and second host materials is deposited within one light emission layer/emissive layer (EML) chamber.

Table 3 show the structures, materials, and deposition thicknesses of B-1, B-2, C-1, C-2, C-3, C-4, C-5, D-1, D-2, and D-3 elements, the following Table 4-1 show the driving voltage V, driving current mA, driving current density J(mA/cm2), light emission efficiency cd/A, luminance cd/m2, power efficiency lm/W, and color coordinates x,y of the elements of Table 3, and Table 4-2 show the driving voltage V, driving current mA/cm2, light emission efficiency cd/A, power efficiency lm/W, color coordinates x,y, and photonic efficiency EQE(%) measured at 2200 nits.

Figure 9:
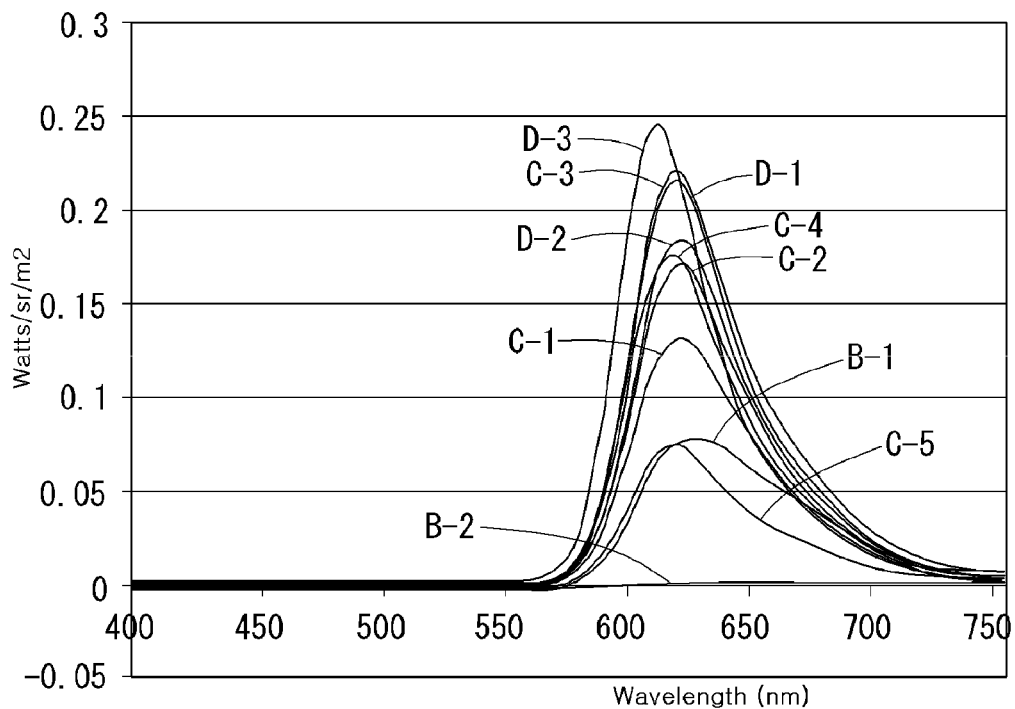
FIG. 9 shows an EL spectrum of the elements of Table 3.
Figure 10:
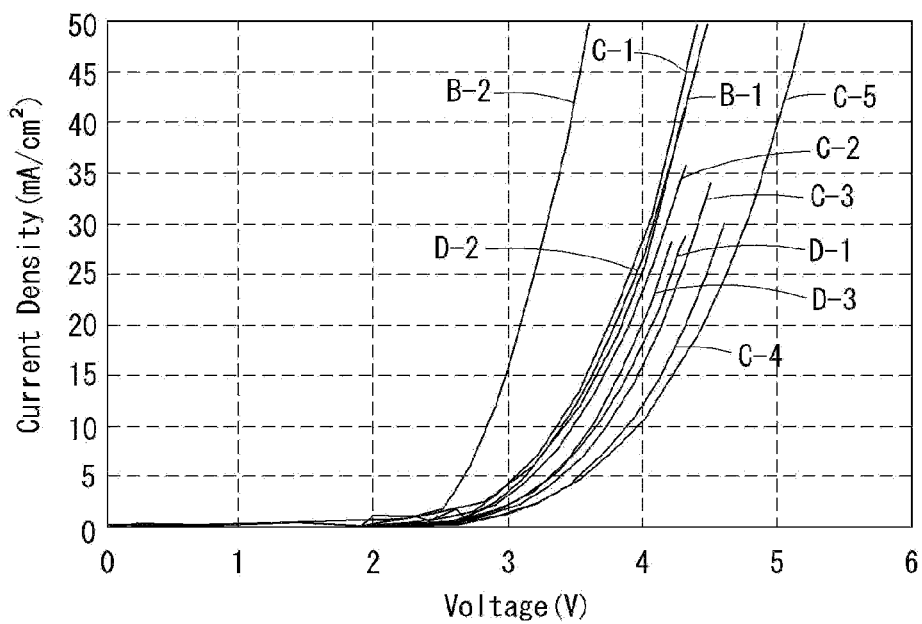
FIG. 10 is a graph showing the driving voltage versus driving current for the elements of Table 3.
Figure 11:
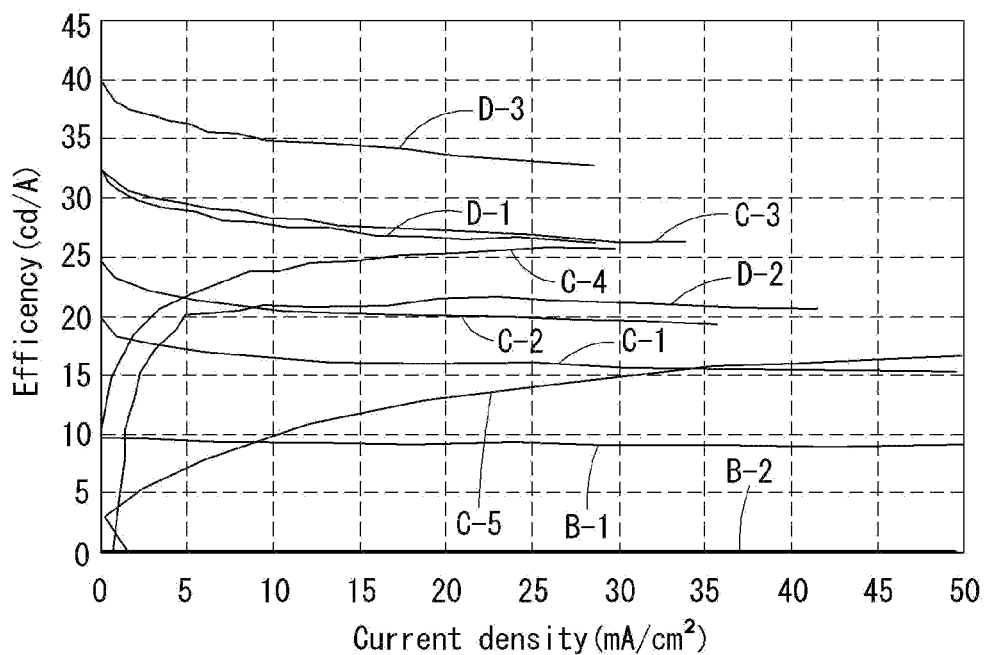
FIG. 11 is a graph showing the light emission efficiency versus driving current for the elements of Table 3.

FIG. 9 shows an EL spectrum of the elements of Table 3, FIG. 10 shows the driving voltage versus driving current for the elements of Table 3, and FIG. 11 shows the light emission efficiency versus driving current for the elements of Table 3.

In Table 3, the emission layer structures of B-1 and B-2 used the non-mixed layer (Host B or Host A and dopant X),

TABLE 3

| | EL structure | | | | thickness in Å in parentheses | |
|---|---|---|---|---|---|---|
| | HIL chamber | EML chamber | | | Metal chamber | CPL chamber |
| | HIL | Host A | Host A + Host B | Host B | Cathode | CPL |
| B1 | HATCN (50) | (25) | Host B, dopant X 3% (1_1050) | (25) | LiF(10)/ Mg:Ag (9:1_140) | NPD (650) |
| B2 | | (25) | Host A, dopant X 3% (1_1050) | (25) | | |
| C1 | | (25) | Host A + B, dopant X 3% (3:1_1050) | (25) | | |
| C2 | | (25) | Host A + B, dopant X 3% (2:1_1050) | (25) | | |
| C3 | | (25) | Host A + B, dopant X 3% (1:1_1050) | (25) | | |
| C4 | | (25) | Host A + B, dopant X 3% (1:2_1050) | (25) | | |
| C5 | | (25) | Host A + B, dopant X 3% (1:3_1050) | (25) | | |
| D1 | | (25) | Host A + B, dopant X 6% (1:1_1050) | (25) | | |
| D2 | | (25) | Host A + B, dopant X 9% (1:1_1050) | (25) | | |
| D3 | | (25) | Host A + B, dopant X 1% (1:1_1050) | (25) | | |

TABLE 4-1

| | V | mA | J(mA/cm$^2$) | cd/A | lm/W | cd/m$^2$ | x | y | others |
|---|---|---|---|---|---|---|---|---|---|
| B-1 | 3.6 | 0.9 | 10 | 9.6 | 8.3 | 955.2 | 0.6738 | 0.3231 | |
| B-2 | 2.9 | 0.9 | 10 | 0.11 | 0.1 | 10.98 | 0.6719 | 0.3097 | |
| C-1 | 3.5 | 0.9 | 10 | 16.6 | 14.8 | 1655 | 0.6689 | 0.3282 | |
| C-2 | 3.6 | 0.9 | 10 | 21.2 | 18.4 | 2119 | 0.6679 | 0.3288 | |
| C-3 | 3.9 | 0.9 | 10 | 27.7 | 22.6 | 2767 | 0.6672 | 0.3301 | |
| C-4 | 4.1 | 0.9 | 10 | 22.3 | 16.9 | 2231 | 0.6648 | 0.332 | |
| C-5 | 4.2 | 0.9 | 10 | 9.4 | 7.1 | 938 | 0.6662 | 0.3311 | |
| D-1 | 3.9 | 0.9 | 10 | 27.0 | 21.8 | 2695 | 0.6663 | 0.3307 | |
| D-2 | 3.5 | 0.9 | 10 | 22.2 | 19.7 | 2222 | 0.6702 | 0.3273 | |
| D-3 | 3.7 | 0.9 | 10 | 34.3 | 29.0 | 3425 | 0.6517 | 0.3455 | |

TABLE 4-2

| | | | | | measured at 2200 nits | | |
|---|---|---|---|---|---|---|---|
| | Volt | mA/cm2 | cd/A | lm/W | x | y | EQE (%) |
| B-1 | 3.9 | 23.9 | 9.2 | 7.4 | 0.673 | 0.324 | 11.0 |
| B-2 | 11.2 | 1991.9 | 0.2 | 0.1 | 0.334 | 0.153 | 0.4 |
| C-1 | 3.5 | 13.5 | 16.3 | 14.5 | 0.669 | 0.329 | 15.8 |
| C-2 | 3.5 | 10.7 | 20.5 | 18.3 | 0.668 | 0.329 | 19.3 |
| C-3 | 3.6 | 7.6 | 28.9 | 25.3 | 0.667 | 0.330 | 26.3 |
| C-4 | 3.8 | 9.3 | 23.6 | 19.3 | 0.665 | 0.332 | 20.6 |
| C-5 | 4.3 | 17.4 | 12.6 | 9.2 | 0.666 | 0.331 | 11.3 |
| D-1 | 3.5 | 7.8 | 28.0 | 25.0 | 0.667 | 0.331 | 24.7 |
| D-2 | 3.5 | 10.6 | 20.8 | 18.9 | 0.670 | 0.327 | 19.6 |
| D-3 | 3.4 | 6.2 | 35.5 | 32.8 | 0.652 | 0.345 | 24.7 |

The structures of Table 3 comprise a non-mixed-layer structure in which one of two types of materials including the first and second host materials is deposited within one EML chamber and a mixed structure in which the two types of materials including the first and second host materials are deposited therebetween. In all of the structures of Table 3, a non-mixed layer or mixed layer is included between the first host layer (Host A) and the second host layer (Host B), and the mixing ratio of the mixed layer and the doping concentration of the dopant were varied.

the emission layer structures of C-1 to C-5 use the mixed layer (Host A+Host B and dopant X), and the emission layer structures of D-1 to D-3 use the mixed layer (Host A+Host B and dopant X) and differ in mixing ratio and doping concentration. Here, C-1 to C-5 and D-1 to D-3 correspond to the structures of the first exemplary embodiment of the present invention.

According to the test results, the emission layer structures showed high efficiency when the mixed layer (Host A+Host B and dopant X) was used, as compared to when the non-mixed layer (Host B or Host A and dopant X) was used. The emission layer structures showed high efficiency when the mixing ratio of the first and second host materials of the mixed layer (Host A+Host B and dopant X) was 1:1. Especially, the emission layer structures showed highest efficiency when the mixing ratio of the first and second host materials constituting the mixed layer (Host A+Host B and dopant X) was 1:1 and the doping concentration of the dopant was 1%.

A comparison will be made below between the conventional structure ((a) of FIG. 5) and the test example D-3 (hereinafter, first exemplary embodiment) of Table 3 that showed highest efficiency.

The following Table 5 show the structures, materials, and deposition thicknesses of the conventional structure and the element of the first exemplary embodiment, and the following Table 6 show the driving voltage V, driving current mA, driving current density J(mA/cm2), light emission efficiency cd/A, luminance cd/m2, power efficiency lm/W, and color coordinates x,y of the element of Table 5.

Figure 12:
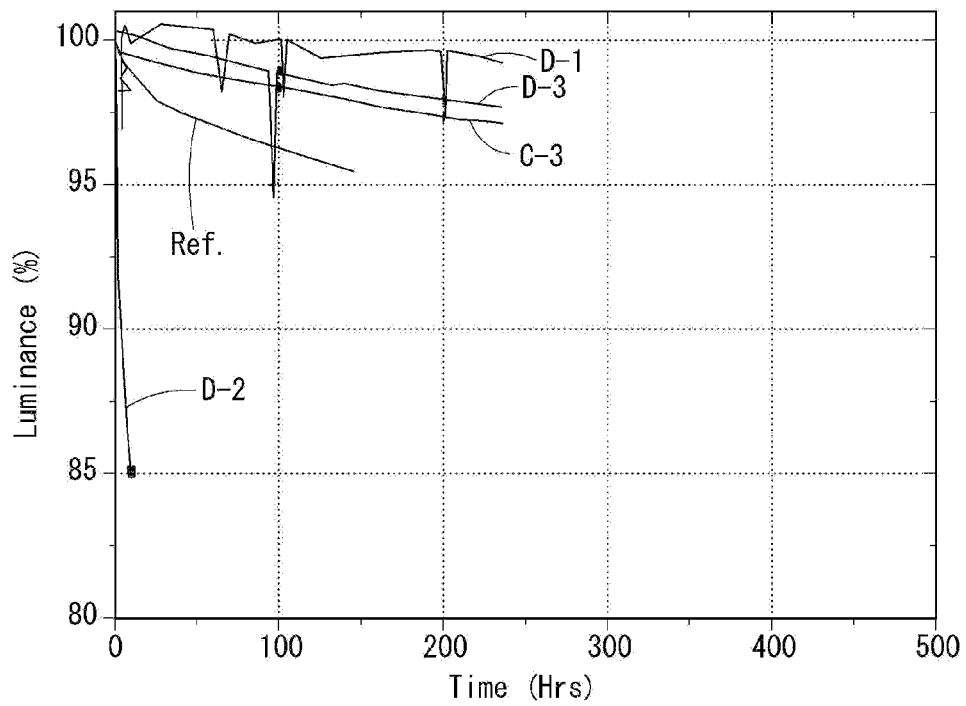
FIG. 12 is a graph showing the life-spans of the conventional structure and the structures of the first exemplary embodiment.

FIG. 12 is a graph showing the life-spans of the conventional structure and the structures of the first exemplary embodiment.

TABLE 5

| | EL structure | | | | | | |
|---|---|---|---|---|---|---|---|
| | HIL chamber HIL | HTL chamber HTL1 | R' HTL chamber HTL2 | R EML chamber Host B | ETL chamber ETL | Metal chamber Cathode | CPL chamber CPL |
| Ref | HATCN (50) | NPD (1200) | TPD (750) | Host + dopant X (450) | Alq3 (360) | LiF(10)/ Mg:Ag (9:1_140) | NPD (650) |
| D-3 | | — | — | Host A + B dopant X (1100) | — | | |

TABLE 6

| | V | J(mA/cm$^2$) | cd/A | lm/W | cd/m$^2$ | x | y | others |
|---|---|---|---|---|---|---|---|---|
| Ref. | 4.8 | 5.2 | 40.4 | 27.6 | 0.653 | 0.345 | 24.7 | 2200 nit |
| D-3 | 3.4 | 6.2 | 35.5 | 32.8 | 0.652 | 0.345 | 24.7 | 2200 nit |

As can be seen from Table 5 and Table 6, the structure D-3 of the first exemplary embodiment showed lower efficiency than the conventional structure Ref, but achieved lower driving voltage. Accordingly, the structure D-3 of the first exemplary embodiment showed improvement by 18% in terms of power efficiency, compared to the conventional structure Ref. Also, as shown in FIG. 12, D-1 to D-3, among the structures of the first exemplary embodiment, were 2 to 3 times superior than the conventional structure Ref in terms of life-span.

As can be seen through the above test examples, better light emission efficiency, power efficiency, and life-span are observed when the thickness of the mixed layer (Host A+Host B and dopant X) is larger than the total thickness of the first host layer (Host A) and the second host layer (Host B). The thicknesses of the mixed layer (Host A+Host B and dopant X), the first host layer (Host A), and the second host layer (Host B) may be varied depending on the deposition length and/or deposition rate of the deposition source unit for depositing a given material, which will be discussed in the manufacturing method to be described later.

In the structures of the first exemplary embodiment, the cathode may be an electrode of LiF:X/X:Ag, where X is none, a metal, or an inorganic material. The metal, as used herein, refers to a metal having a low work function, such as Mg, Yb, Li, and Ca. The thickness of a Lif-containing part of the cathode may range between 10 Å and 50 Å, and the thickness of an Ag-containing part of the cathode may range between 20 Å and 400 Å, and the ratio between both parts may range 1:10 to 10:1.

The thickness of the emission layer may be set with respect to the PL max peak of the dopant under the following conditions. The thickness of the emission layer may be varied depending on the value d.

Thickness of reinforcement interference in microcavity:
$2nd = m\lambda$ where n denotes the refractive index of an organic material, d denotes thickness (nm), m denotes the order of phase waves=1, and λ denotes desired central wavelength= (B=440~470, G=550~550, R=600~630).

From the above-set value d, the thickness of the emission layer may be obtained by d−(total thickness of hole injection layer and anode), and may have the range of ±30 nm. The present invention is not limited thereto because this range may be varied depending on the materials of the elements.

For reference, the first host material, second host material, and dopant material used in the above test and the HOMO, LUMO, and energy gap (E gap) thereof are as shown in the following Table 7.

TABLE 7

| | test material | HOMO | LUMO | E gap | others |
|---|---|---|---|---|---|
| Host 1 | NPD | −5.5 | −2.5 | 3 | Host A |
| Host 2 | Be complex derivative | −5.8 | −3 | 2.8 | Host B |
| dopant X | Ir complex derivative | −5.1 | −3.1 | 2 | Dopant | where the first host material (Host A) may be a material having a HOMO level ranging from −5.0 to −5.5 eV, and the second host material (Host B) may be a material having a LUMO level of greater than or equal to −3 eV.

Hereinafter, modifications of the first exemplary embodiment will be described.

Figure 13:
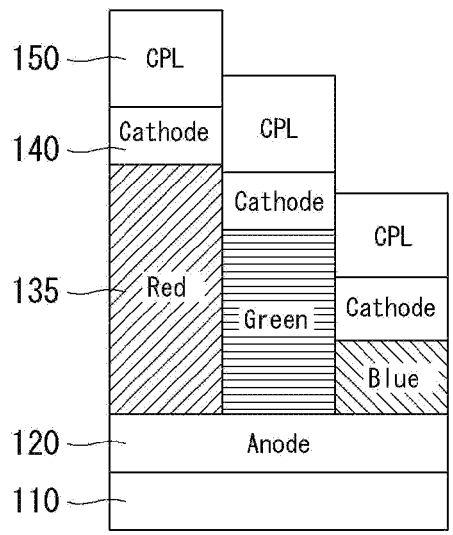
FIG. 13 shows a first modification of the first exemplary embodiment.
Figure 14:
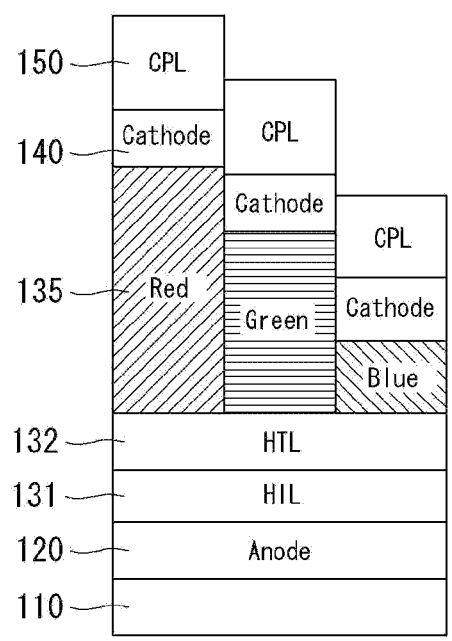
FIG. 14 shows a second modification of the first exemplary embodiment.
Figure 15:
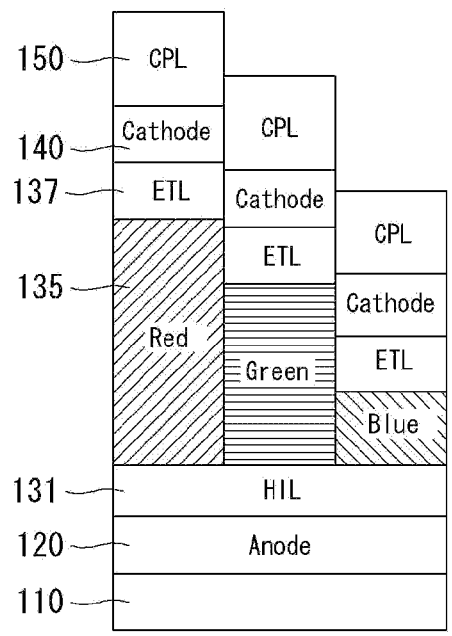
FIG. 15 shows a third modification of the first exemplary embodiment.

FIG. 13 shows a first modification of the first exemplary embodiment, FIG. 14 shows a second modification of the first exemplary embodiment, and FIG. 15 shows a third modification of the first exemplary embodiment.

In the first to third modifications, the structure of the emission layer 135 is formed in the same way as the above-described first exemplary embodiment. That is, the first host layer, mixed layer, and second host layer constituting the emission layer 135 each differ in thickness among the RGB subpixels, like one of the patterns of the first illustration of FIG. 2, second illustration of FIG. 3, and third illustration of FIG. 4.

The first host material constituting the first host layer and the second host material constituting the second host layer are different from each other. For example, the first host material is a hole-type material having a higher hole transportability than the second host material has, and the second host material is an electron-type material having a higher electron transportability than the first host material has.

As shown in FIG. 13, the first modification has a structure in which the hole injection layer HIL is omitted. Accordingly, the RGB subpixels of the first modification have a structure consisting of the lower electrode 120, the emission layer 135, the upper electrode 140, and the protective layer 150. In the first modification, a hole-type material having good hole injection and transport properties and an electron-type material having good electron injection and transport properties are used to form the first host layer and the second host layer.

As shown in FIG. 14, the second modification has a structure in which the hole injection layer HIL and the hole transport layer HTL are added. Accordingly, the RGB subpixels of the second modification have a structure consisting of the lower electrode 120, the hole injection layer 131, the hole transport layer 132, the emission layer 135, the upper electrode 140, and the protective layer 150.

As shown in FIG. 15, the third modification has a structure in which the hole injection layer HIL and the electron transport layer ETL are added. Accordingly, the RGB subpixels of the third modification have a structure consisting of the lower electrode 120, the hole injection layer 131, the emission layer 135, the electron transport layer 137, the upper electrode 140, and the protective layer 150.

As in the first to third modifications, one or more may be selected from the hole injection layer 131, the hole transport layer 132, and the electron transport layer 137 to comprise functional layers for the RGB subpixels. Non-selected layers may be omitted (or eliminated) from the functional layers constituting the RGB subpixels to achieve a simplified structure.

The reason why the functional layers included in the RGB subpixels can be omitted as in the first to third modifications is because the first host layer and the second host layer are formed of a hole-type material and an electron-type material, respectively.

Although the first to third modifications illustrate only the hole injection layer 131, the hole transport layer 132, and the electron transport layer 137 as an example of the functional layers, the hole injection layer may be further included.

The structures of the first exemplary embodiment and modifications focus on an example in which the subpixels comprise RGB subpixels emitting red, green, and blue light. However, the present invention is not limited by the structures of the first exemplary embodiment and modifications, but is applicable to the following structure.

<Second Exemplary Embodiment>

Figure 16:
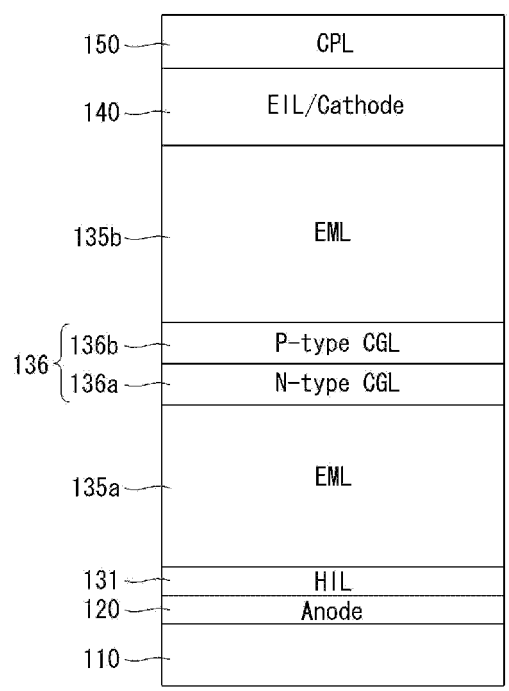
FIG. 16 is a view showing the structure of a subpixel according to a second exemplary embodiment of the present invention.

FIG. 16 is a view showing the structure of a subpixel according to a second exemplary embodiment of the present invention.

As shown in FIG. 16, the second exemplary embodiment of the present invention is also applied to a subpixel having a stack structure of at least two emission layers. The subpixel having the stack structure may emit white light using two emission layers, and also may emit light of different colors.

The subpixel having the stack structure according to the second exemplary embodiment of the present invention comprises a lower electrode 120, first and second emission layers EML1 and EML2 135a and 135b, a functional layer 131, an intermediate layer 136, an upper electrode 140, and a protective layer 150. The protective layer 150 may be omitted depending on the structure. The second exemplary embodiment will be described on an example in which the lower electrode 120 acts as an anode and the upper electrode 140 acts as a cathode. Also, a description will be made on an example in which the upper electrode 140 acting as a cathode also functions as an electron injection layer EIL.

According to the second exemplary embodiment of the present invention, one or two of the first and second emission layers 135a and 135b comprise a first host layer, a mixed layer, and a second host layer, as in the first exemplary embodiment. Also, at least one of the first host layer, mixed layer, and second host layer constituting each of the first and second emission layers 135a and 135b has a different thickness. A detailed description of which will be made with reference to the first exemplary embodiment.

The functional layer HIL 131 serves to inject holes into the first emission layer 135a. The functional layer 131 exists between the lower electrode 120 and the first emission layer 135a, and acts as a hole injection layer HIL.

The intermediate layer 136 serves to control the energy band gap for the interface between the first and second emission layers 135a and 135b and generate charges. The intermediate layer 136a and 136b is divided into an N-type first intermediate layer 136a (N-type charge generation layer (CGL)) and a P-type second intermediate layer 136b (P-type CGL). That is, the first intermediate layer 136a and the second intermediate layer 136b are formed in different chambers.

Meanwhile, the functional layer, for example, the hole injection layer HIL, hole transport layer HTL, and electron transport layer ETL, is selectively formed depending on the first host layer, mixed layer, and second host layer constituting the first and second emission layers 135a and 135b. That is, the hole injection layer HIL, the hole transport layer HTL, and the electron transport layer ETL may not be formed, or at least one of them is omitted.

Hereinafter, modifications of the second exemplary embodiment will be described.

Figure 17:
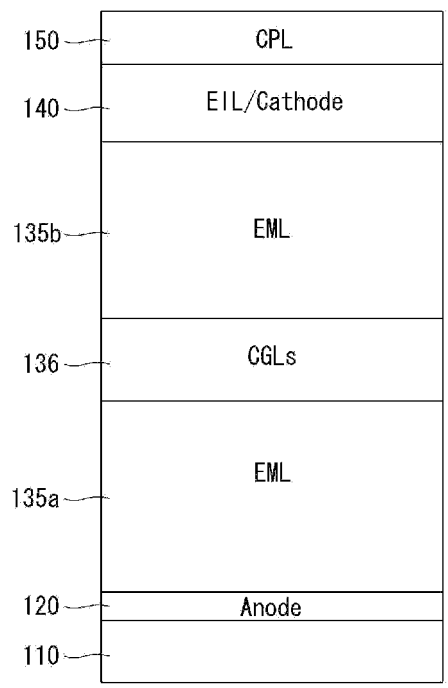
FIG. 17 shows a first modification of the second exemplary embodiment.
Figure 18:
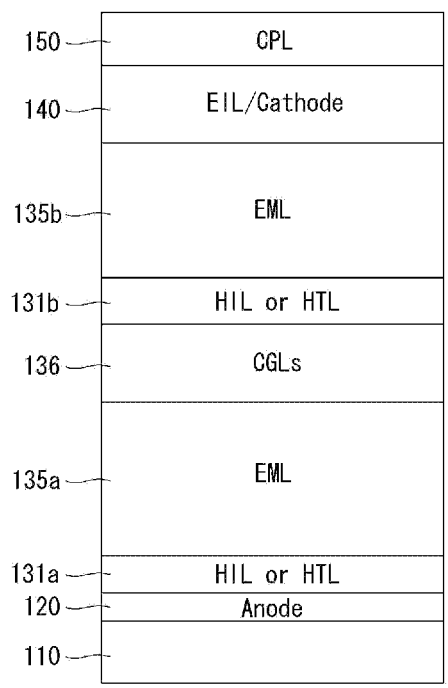
FIG. 18 shows a second modification of the second exemplary embodiment.
Figure 19:
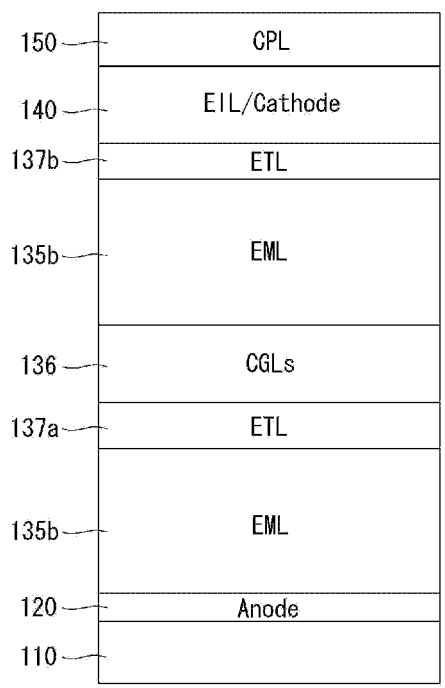
FIG. 19 shows a third modification of the second exemplary embodiment.

FIG. 17 shows a first modification of the second exemplary embodiment, FIG. 18 shows a second modification of the second exemplary embodiment, and FIG. 19 shows a third modification of the second exemplary embodiment.

As shown in FIG. 17, the first modification is also applied to a subpixel having a stack structure of at least two emission layers. The subpixel having the stack structure may emit white light using two emission layers, and also may emit light of different colors.

The subpixel having the stack structure according to the first modification comprises a lower electrode 120, first and second emission layers EML1 and EML2 135a and 135b, an intermediate layer 136, an upper electrode 140, and a protective layer 150. The protective layer 150 may be omitted depending on the structure. The first modification also will be described on an example in which the lower electrode 120 acts as an anode and the upper electrode 140 acts as a cathode. Also, a description will be made on an example in which the upper electrode 140 acting as a cathode also functions as an electron injection layer EIL.

According to the first modification, one or two of the first and second emission layers 135a and 135b likewise comprise a first host layer, a mixed layer, and a second host layer, as in the first exemplary embodiment. Also, at least one of the first host layer, mixed layer, and second host layer constituting each of the first and second emission layers 135a and 135b has a different thickness. A detailed description of which will be made with reference to the first exemplary embodiment.

The intermediate layer CLGs 136 serves to control the energy band gap for the interface between the first and second emission layers 135a and 135b and generate charges. However, the intermediate layer 136 according to the first modification is not divided into an N-type first intermediate layer and a P-type second intermediate layer, but instead formed as a single layer. That is, the intermediate layer 136 is formed in an integrated manner in a single chamber.

Moreover, all the functional layers are omitted in the stack structure according to the first modification, unlike the second exemplary embodiment. That is, all the functional layers are omitted and do not exist.

As shown in FIG. 18, the second modification is also applied to a subpixel having a stack structure of at least two emission layers. The subpixel having the stack structure may emit white light using two emission layers, and also may emit light of different colors.

The subpixel having the stack structure according to the second modification comprises a lower electrode 120, first and second emission layers EML1 and EML2 135a and 135b, functional layers 131a and 131b, an intermediate layer 136, an upper electrode 140, and a protective layer 150. The protective layer 150 may be omitted depending on the structure. The second modification also will be described on an example in which the lower electrode 120 acts as an anode and the upper electrode 140 acts as a cathode. Also, a description will be made on an example in which the upper electrode 140 acting as a cathode also functions as an electron injection layer EIL.

According to the second modification, one or two of the first and second emission layers 135a and 135b likewise comprise a first host layer, a mixed layer, and a second host layer, as in the first exemplary embodiment. Also, at least one of the first host layer, mixed layer, and second host layer constituting each of the first and second emission layers 135a and 135b has a different thickness. A detailed description of which will be made with reference to the first exemplary embodiment.

The intermediate layer CLGs 136 serves to control the energy band gap for the interface between the first and second emission layers 135a and 135b and generate charges. However, the intermediate layer 136 according to the second modification is not divided into an N-type first intermediate layer and a P-type second intermediate layer, but instead formed as a single layer. That is, the intermediate layer 136 is formed in an integrated manner in a single chamber.

Moreover, the two functional layers 131a and 131b exist in the stack structure according to the second modification, unlike the second exemplary embodiment. The first functional layer 131a exists between the lower electrode 120 and the first emission layer 135a, and the second functional layer 131b exists between the intermediate layer 136 and the second emission layer 135b. The first and second functional layers 131a and 131b act as the hole injection layer HIL or the hole transport layer HTL. Here, the first and second function layers 131a and 131b may be replaced with other functional layers depending on the characteristics of the materials of which the first host layer and the second host layer are made.

As shown in FIG. 19, the third modification is also applied to a subpixel having a stack structure of at least two emission layers. The subpixel having the stack structure may emit white light using two emission layers, and also may emit light of different colors.

The subpixel having the stack structure according to the third modification comprises a lower electrode 120, first and second emission layers EML1 and EML2 135a and 135b, functional layers 137a and 137b, an intermediate layer 136, an upper electrode 140, and a protective layer 150. The protective layer 150 may be omitted depending on the structure. The third modification also will be described on an example in which the lower electrode 120 acts as an anode and the upper electrode 140 acts as a cathode. Also, a description will be made on an example in which the upper electrode 140 acting as a cathode also functions as an electron injection layer EIL.

According to the third modification, one or two of the first and second emission layers 135a and 135b likewise comprise a first host layer, a mixed layer, and a second host layer, as in the first exemplary embodiment. Also, at least one of the first host layer, mixed layer, and second host layer constituting each of the first and second emission layers 135a and 135b has a different thickness. A detailed description of which will be made with reference to the first exemplary embodiment.

The intermediate layer CLGs 136 serves to control the energy band gap for the interface between the first and second emission layers 135a and 135b and generate charges. However, the intermediate layer 136 according to the third modification is not divided into an N-type first intermediate layer and a P-type second intermediate layer, but instead formed as a single layer. That is, the intermediate layer 136 is formed in an integrated manner in a single chamber.

Moreover, the two functional layers 137a and 137b exist in the stack structure according to the third modification, unlike the second exemplary embodiment. The first functional layer 137a exists between the first emission layer 135a and the intermediate layer 136, and the second functional layer 137b exists between the second emission layer 135b and the upper electrode 140. The first and second functional layers 137a and 137b act as the electron transport layer ETL. Here, the first and second function layers 137a and 137b may be likewise replaced with other functional layers depending on the characteristics of the materials of which the first host layer and the second host layer are made.

The second exemplary embodiment and the modifications of the second exemplary embodiment have been described regarding only the four structures, with respect to an example in which only specific functional layers exist. However, the functional layers may comprise at least one of the following: the hole injection layer HIL, the hole transport layer HTL, the electron blocking layer EBL, the hole blocking layer HBL, the electron transport layer ETL, and the electron injection layer EIL. Also, all the layers included in the functional layers may be omitted, or one or more of them may exist, depending on the materials of which the first host layer and the second host layer are made.

Namely, it goes without saying that the structure of the emission layer according to the second exemplary embodiment of the present invention may be formed and applied to other stack structures (not shown), as well as to the stack structures of FIGS. 16 to 19, in the same manner as the first exemplary embodiment.

The present invention is not limited to the structures of the first and second exemplary embodiments, but is applicable to the following structure.

<Third Exemplary Embodiment>

Figure 20:
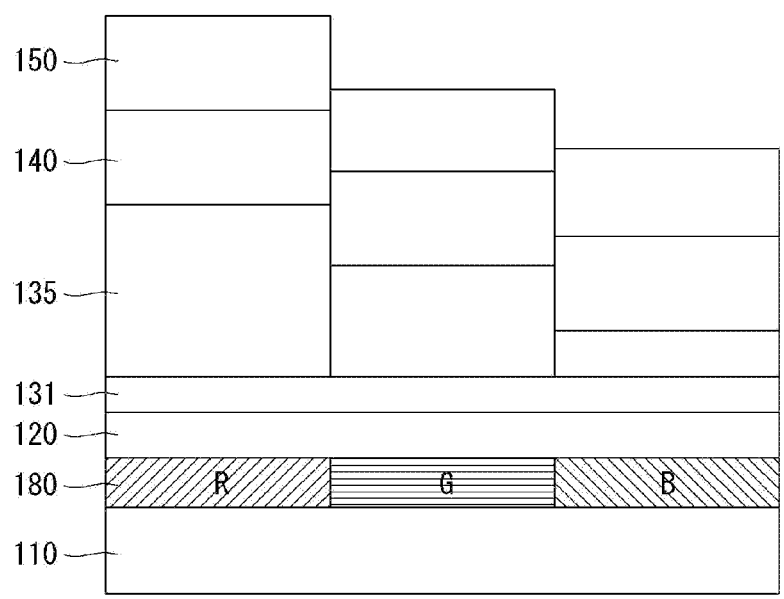
FIG. 20 is a view showing the structure of subpixels according to a third exemplary embodiment of the present invention.

FIG. 20 is a view showing the structure of subpixels according to a third exemplary embodiment of the present invention.

As shown in FIG. 20, the third exemplary embodiment is also applicable to a structure having a color conversion layer 180 for converting white light of white subpixels into red R, green G, and blue B.

The third exemplary embodiment is similar to the first exemplary embodiment, except that all the subpixels comprise white subpixels, and the color conversion layer 180 for converting white light into red R, green G, and blue B is added.

According to the third exemplary embodiment of the present invention, an emission layer 135 emitting white light comprises a first host layer, a mixed layer, and a second host layer, like the first exemplary embodiment. At least one of the layers constituting the emission layer 135 has a different thickness corresponding to a color obtained through conversion by the color conversion layer 180. For example, the thicknesses of the layers constituting the emission layer 135 are in the order of the emission layer 135 corresponding to an R color conversion layer 180 >the emission layer 135 corresponding to a G color conversion layer 180 >the emission layer 135 corresponding to a B color conversion layer 180.

The third exemplary embodiment has been described with respect to an example in which the color conversion layer 180 is positioned between a substrate 110 and a lower electrode 120. However, the color conversion layer 180 may be positioned between an upper electrode 140 and a protective layer 150, or on top of the protective layer 150, or on an inner surface of a protective substrate to be sealed, together with the substrate 110.

Hereinafter, a manufacturing method for forming the structure of subpixels according to exemplary embodiments of the present invention will be described.

<Fourth Exemplary Embodiment>

Figure 21:
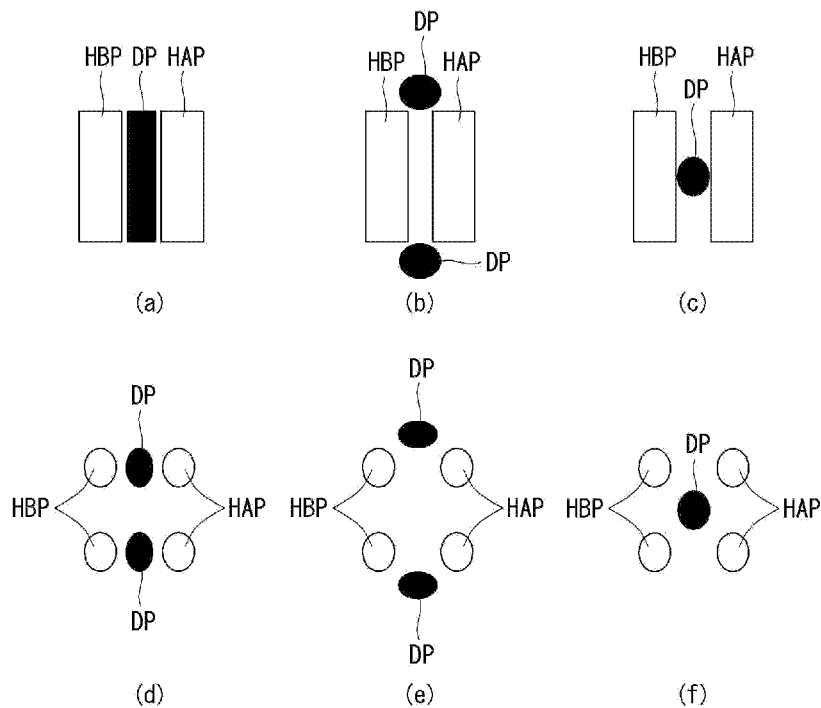
FIG. 21 is a cross-sectional view of a source deposition unit according to a fourth exemplary embodiment of the present invention.
Figure 22:
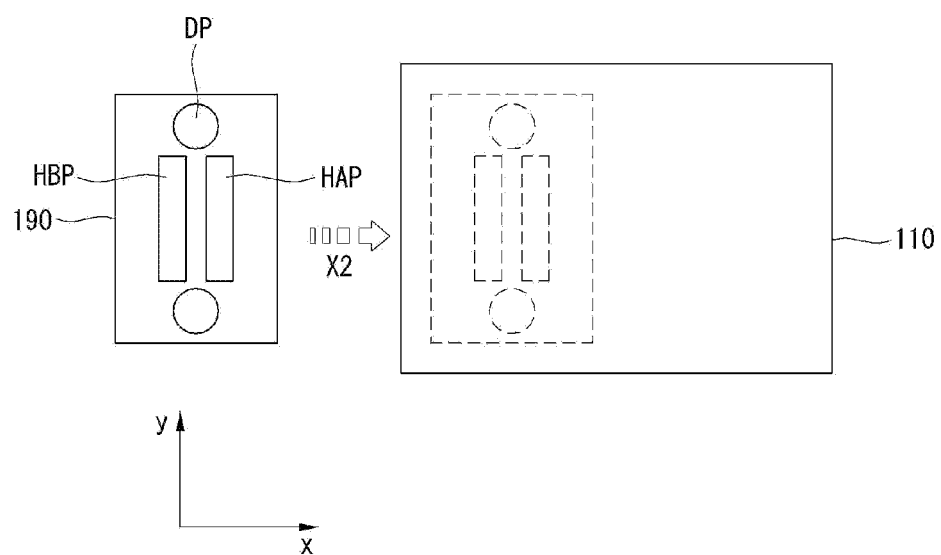
FIGS. 22 and 23 are views for explaining a process method for the source deposition method.
Figure 23:
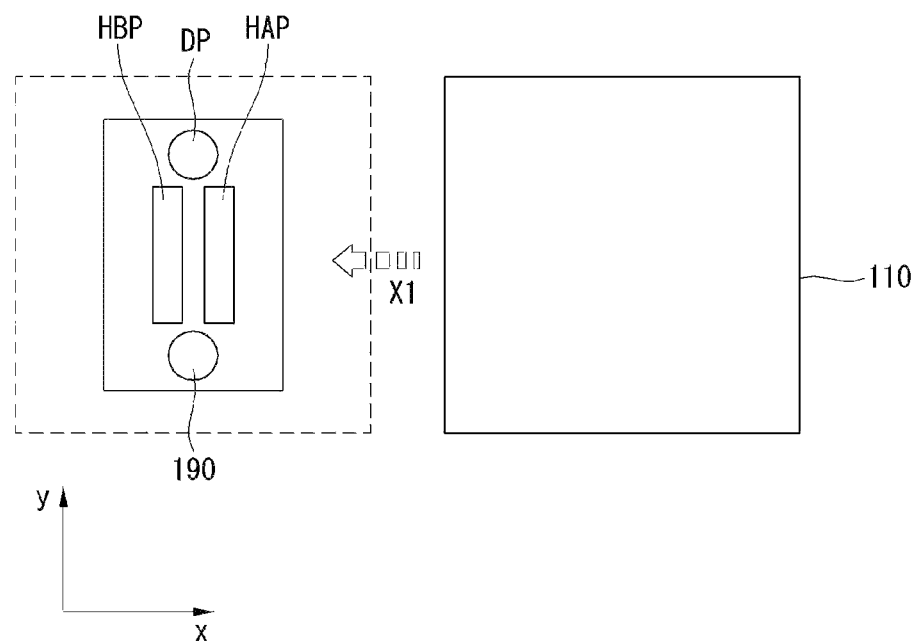
Figure 24:
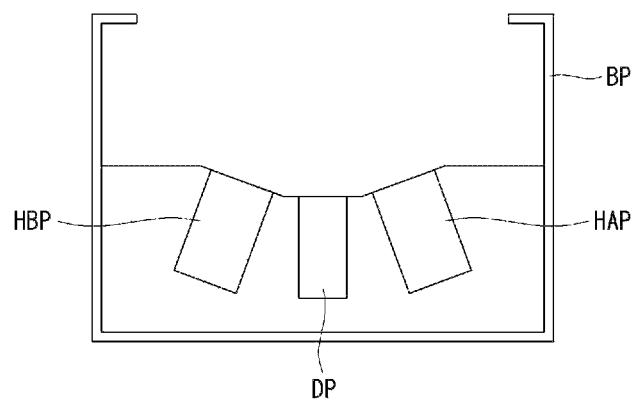
FIG. 24 is a side view exemplifying the layout of the source deposition unit.
Figure 24:
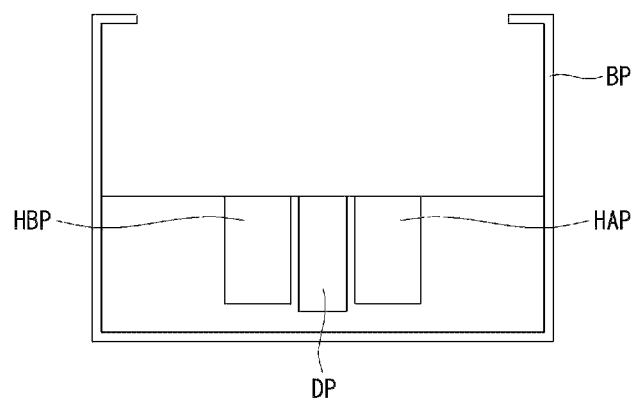
Figure 25:
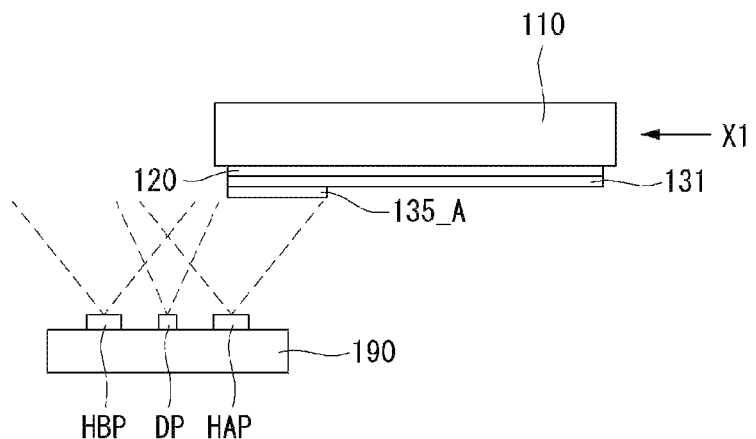
FIGS. 25 to 27 illustrate a manufacturing method according to the fourth exemplary embodiment of the present invention.
Figure 26:
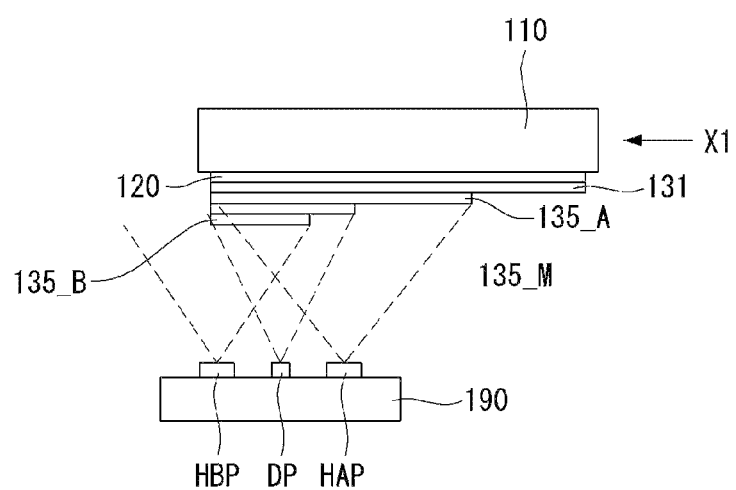
Figure 27:
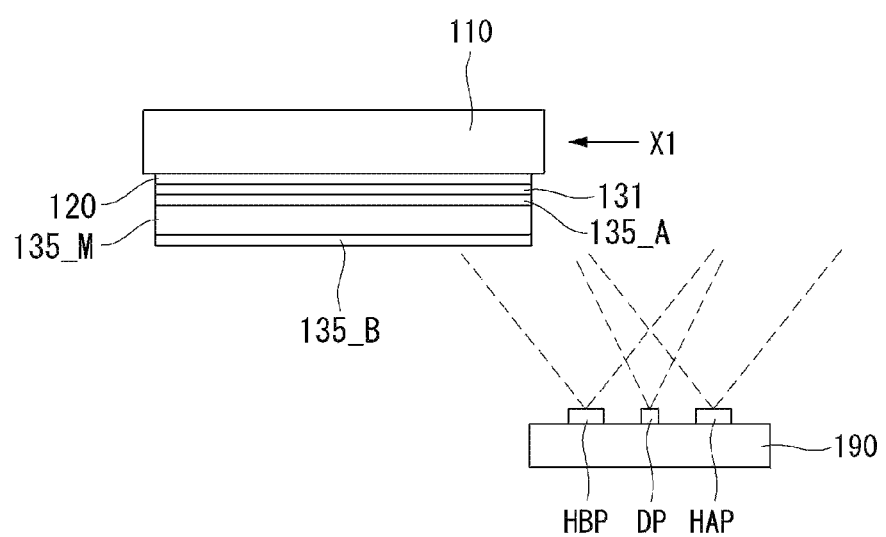

FIG. 21 is a cross-sectional view of a source deposition unit according to a fourth exemplary embodiment of the present invention. FIGS. 22 and 23 are views for explaining a process method for the source deposition method. FIG. 24 is a side view exemplifying the layout of the source deposition unit. FIGS. 25 to 27 are flowcharts for explaining a manufacturing method according to the fourth exemplary embodiment of the present invention.

As shown in FIG. 21, in the fourth exemplary embodiment of the present invention, an emission layer is formed using a chamber comprising a source deposition unit provided with first and second host sources HAP and HBP respectively containing first and second host materials and a dopant source DP containing a dopant material.

As shown in (a) of FIG. 21, the source deposition unit may have rectangular (or square) second and first host sources HBP and HAP respectively provided at the left and right sides and a rectangular (or square) dopant source DP provided at the center between the second and first host sources HBP and HAP. Only one dopant source DP is provided in this structure.

As shown in (b) of FIG. 21, the source deposition unit may have rectangular (or square) second and first host sources HBP and HAP respectively provided at the left and right sides and round (or pointed) dopant sources DP provided above and below a central area neighboring the second and first host sources HBP and HAP. Two dopant sources DP are provided in this structure.

As shown in (c) of FIG. 21, the source deposition unit may have rectangular (or square) second and first host sources HBP and HAP respectively provided at the left and right sides and a round (or pointed) dopant source DP provided at the center between the second and first host sources HBP and HAP. Only one dopant source DP is provided in this structure.

As shown in (d) of FIG. 21, the source deposition unit may have a pair of rectangular (or square) second host sources HBP and a pair of first host sources HAP respectively provided at the left and right sides and round (or pointed) dopant sources DP provided in a central area so as to respectively correspond to the pairs of the second and first host sources HBP and HAP. Two second host sources HBP, two first host sources HAP, and two dopant sources DP are provided in this structure.

As shown in (e) of FIG. 21, the source deposition unit may have a pair of rectangular (or square) second host sources HBP and a pair of first host sources HAP respectively provided at the left and right sides and round (or pointed) dopant sources DP provided above and below a central area so as to respectively correspond to the pairs of the second and first host sources HBP and HAP. Two second host sources HBP, two first host sources HAP, and two dopant sources DP are provided in this structure.

As shown in (f) of FIG. 21, the source deposition unit may have a pair of rectangular (or square) second host sources HBP and a pair of first host sources HAP respectively provided at the left and right sides and a rectangular (or square) dopant source DP provided at the center between the pairs of the second and first host sources HBP and HAP. Two second host sources HBP, two first host sources HAP, and only one dopant source DP are provided in this structure.

The dopant source DP and the second and first host sources HBP and HAP constituting the source deposition unit are not limited to the above-described shapes, but may have a variety of shapes. If the dopant source DP and the second and first host sources HBP and HAP constituting the source deposition unit are in a round (or pointed) shape, the number of them can be increased.

Hereinafter, a deposition method using a source deposition unit will be described.

As shown in FIG. 22, a source deposition unit 190 may be provided to deposit a first host material, a second host material, and a dopant material while moving as if it scans a substrate 110. At this point, the source deposition unit 190 can move in the X2 direction as if scanning toward the substrate 110. The source deposition unit 190 has a size (in other words, deposition area) large enough to cover first and second host sources HAP and HBP and a dopant source DP. That is, the source deposition unit 190 may move in the Y direction and scan in the opposite direction, if necessary.

As shown in FIG. 23, the source deposition unit 190 may be fixed, and the substrate 110 may be provided to deposit the first host material, the second host material, and the dopant material while moving as if it scans the source deposition unit 190. At this point, the substrate 110 can move in the X1 direction as if scanning toward the source deposition unit 190. The substrate 110 has a size (in other words, deposition area) large enough to cover the first and second host sources HAP and HBP and the dopant source DP. That is, the substrate 110 may move in the Y direction and scan in the opposite direction, if necessary.

As shown in (a) of FIG. 24, the first and second host sources HAP and HBP may be disposed to be inclined with respect to the dopant source DP, and a deposition film BP may be further disposed to set a deposition range of the first and second host sources HAP and HBP.

As shown in (b) of FIG. 24, the first and second host sources HAP and HBP may be disposed in parallel, and a deposition film BP may be further disposed to set a deposition range of the first and second host sources HAP and HBP Although not shown in (a) and (b) of FIG. 24, a deposition film may be further disposed to set a deposition range of the dopant source DP.

Hereinafter, a method for manufacturing an organic light emitting display device using the above-explained source deposition unit will be described.

As shown in FIGS. 25 to 27, the method for manufacturing an organic light emitting display device according to the fourth exemplary embodiment of the present invention will be described below.

First of all, a thin film transistor portion comprising a switching transistor, a driving transistor, and a capacitor is formed on a substrate 110.

Next, a lower electrode 120 is formed to be connected to a source or drain electrode of the driving transistor included in the thin film transistor portion.

Next, a functional layer 131, e.g., a hole injection layer, is formed on the lower electrode 120. The function layer 131 may be omitted depending on the structure.

Next, a first host layer 135_A made of a first host material is formed on the functional layer 131. As shown in FIG. 25, in the forming of the first host layer 135_A, the substrate 110 moves in the X1 direction as if scanning. Thereafter, the substrate 110 enters a deposition range (first host layer deposition area) of the first host source HAP at a certain point in time. Then, the first host material evaporated from the first host source HAP is firstly deposited, thereby forming only the first host layer 135_A on the functional layer 131.

Next, a mixed layer 135_M made of the first host material, a dopant material, and a second host material is formed on the first host layer 135_A. As shown in FIG. 26, the substrate 110 continues to move in the X1 direction as if scanning. Thereafter, the substrate 110 enters a deposition range (first host layer and mixed layer deposition area) of the first host source HAP, dopant source DP, and second host source HBP at a certain point in time. Then, the first host layer 135_A is formed on the functional layer 131. And, the first host material, dopant material, and second host material evaporated from the first host source HAP, dopant source DP, and second host source HBP are mixed and deposited, thereby forming the mixed layer 135_M on the first host layer 135_A. Thereafter, the substrate 110 enters a deposition range (mixed layer and second host layer deposition area) of the first host source HAP, dopant source DP, and second host source HBP at a certain point in time. Then, the mixed layer 135_M is formed on the first host layer 135_A, and at the same time the substrate 110 continues to move in the X1 direction as if scanning. As a result, the second host layer 135_B made of the second host material is partially formed on the mixed layer 135_M.

Next, the second host layer 135_B made of the second host material is formed on the mixed layer 135_M. As shown in FIG. 27, the substrate 110 continues to move in the X1 direction as if scanning. Thereafter, the substrate 110 enters a deposition range (second host layer deposition range) of the second host source HBP at a certain point in time. Then, the second host material evaporated from the second host source HBP is finally deposited, thereby forming the second host layer 135_B on the mixed layer 135_M.

Next, as shown in FIG. 1, an upper electrode 140 is formed on the second host layer 135_B. If necessary, a protective layer 150 is further formed, and a protective substrate is provided to seal an element formed on the substrate 110.

When executing the process as described above, the materials contained in the first and second host sources HAP and HBP are controlled so that one of the first and second host materials is made of a hole-type material and the other one is made of an electron-type material. Moreover, the process conditions of the source deposition unit 190 are controlled so that at least one of the first host layer 135_A, mixed layer 135_M, and second host layer 135_B differs in thickness among the subpixels. Further, the process conditions of the source deposition unit 190 are controlled so that the electrodes 120 and 140 positioned at the lower and upper sides and the functional layer 131 each are equal in thickness among the subpixels, and only the emission layer 135_A, 135_M, and 135_B differs in thickness among the subpixels.

The thicknesses of the first host layer 135_A, mixed layer 135_M, and second host layer 135_B formed on the substrate 110 are determined according to a deposition order, in proportion to the deposition lengths of the first host source HAP, dopant source DP, and second host source HBP provided on the source deposition unit. Also, the thicknesses of the first host layer 135_A, mixed layer 135_M, and second host layer 135_B are proportional to deposition rate. That is, the thicknesses of the first host layer 135_A, mixed layer 135_M, and second host layer 135_B are determined depending on deposition length and deposition rate.

In the following, an example will be given assuming that the ratio of the deposition lengths of the first host layer 135_A, mixed layer 135_M, and second host layer 135_B is 1:4:1, the deposition rate of the first host source HAP is 1 Å/s, and the deposition rate of the second host source HBP is 2 Å/s. As the mixing ratio of the first host layer 135_A and the second host layer 135_B is 1:2, the thickness ratio of the first host layer 135_A, mixed layer 135_M, and second host layer 135_B is determined as 1:6(1:2):2.

Moreover, when carrying out the process as described above, the process conditions of the source deposition unit 190 are controlled so that the first host material of the mixed layer 135_M has 10 to 90 parts weight, the second host material thereof has 10 to 90 parts weight, and the dopant material thereof has 0.1 to 20 parts weight. For the parts weight of the first host material, second host material, and dopant material constituting the mixed layer 135_M, you may refer to the test examples.

As discussed above, the present invention makes thickness control easy because it uses a small lamination structure, compared to the conventional structure, prevents a rise in manufacturing costs by decreasing the amount of materials used and thickness, and improves light emission efficiency, power efficiency, and life-span. Further, the present invention can minimize defect rate by decreasing the number of processes and the number of fine metal masks.

What is claimed is:

1. An organic light emitting display device comprising:
   a substrate; and
   a plurality of subpixels formed on the substrate,
   each of the subpixels comprising an emission layer comprising a first host layer made of a first host material, a mixed layer made of the first host material, a dopant material, and a second host material, and a second host layer made of the second host material,
   wherein the first host material and the second host material are different from each other, and
   wherein at least some light emission occurs in the mixed layer.

2. The organic light emitting display device of claim 1, wherein one of the first and second host materials is a hole-type material, and the other one is an electron-type material.

3. The organic light emitting display device of claim 1, wherein the electrodes positioned under and above the emission layer are equal in thickness among the subpixels.

4. The organic light emitting display device of claim 1, wherein the emission layer differs in thickness among the subpixels.

5. The organic light emitting display device of claim 1, wherein each of the subpixels additionally comprises one or more functional layers comprising at least one from the group consisting of: a hole injection layer, a hole transport layer, an electron blocking layer, a hole blocking layer, an electron transport layer, and an electron injection layer.

6. The organic light emitting display device of claim 5, wherein no light emission occurs in any of the functional layers.

7. The organic light emitting display device of claim 1, wherein the subpixels emit light of different colors on the substrate and wherein the subpixels have different thicknesses.

8. The organic light emitting display device of claim 1, wherein the subpixels each comprise at least two emission layers,
   one or two of the at least two emission layers comprise the first host layer, the mixed layer, and the second host layer, and
   the subpixels each comprise a first emission layer, an intermediate layer formed on the first emission layer, and a second emission layer formed on the intermediate layer.

9. The organic light emitting display device of claim 1, wherein at least one of the first host layer, the mixed layer, and the second host layer differs in thickness among the subpixels.

10. An organic light emitting display device comprising:
- a substrate; and
- a plurality of subpixels formed on the substrate, each of the subpixels comprising a mixed layer formed of a first host material, a second host material, and a dopant material, wherein a first, second, and third of the subpixels each has a mixed layer of different thickness from each other,
- wherein the first host material and the second host material are different from each other, and
- wherein at least some light emission occurs in the mixed layer.

* * * * *